United States Patent
Sung et al.

(10) Patent No.: US 10,607,847 B1
(45) Date of Patent: Mar. 31, 2020

(54) GATE ALL AROUND DEVICE AND METHOD OF FORMATION USING ANGLED IONS

(71) Applicant: APPLIED Materials, Inc., Santa Clara, CA (US)

(72) Inventors: Min Gyu Sung, Essex, MA (US); Sony Varghese, Manchester, MA (US); Anthony Renau, West Newbury, MA (US); Morgan Evans, Manchester, MA (US); Joseph C. Olson, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/207,932

(22) Filed: Dec. 3, 2018

(51) Int. Cl.
| | |
|---|---|
| H01L 21/3065 | (2006.01) |
| H01L 29/78 | (2006.01) |
| H01L 29/66 | (2006.01) |
| H01L 21/8238 | (2006.01) |
| H01L 29/06 | (2006.01) |
| H01L 27/092 | (2006.01) |
| H01L 21/8234 | (2006.01) |
| H01L 29/423 | (2006.01) |

(52) U.S. Cl.
CPC .. *H01L 21/3065* (2013.01); *H01L 21/823431* (2013.01); *H01L 21/823821* (2013.01); *H01L 27/0924* (2013.01); *H01L 29/0673* (2013.01); *H01L 29/42392* (2013.01); *H01L 29/6681* (2013.01); *H01L 29/7848* (2013.01); *H01L 29/7851* (2013.01); *H01L 29/7853* (2013.01)

(58) Field of Classification Search
CPC .......... H01L 21/3065–30655; H01L 21/31116; H01L 21/31122; H01L 21/31138; H01L 21/67069; H01L 21/32136–32137; H01L 21/02071; H01L 29/0669–068; H01L 29/0665; H01L 2924/13061; H01L 29/66439; H01L 29/66469; H01L 29/7853–2029/7858; H01L 29/78687; H01L 29/78696; H01L 21/823431; H01L 21/823821; H01L 21/845; H01L 27/0886; H01L 27/0924; H01L 27/10826; H01L 27/10879; H01L 27/1211; H01L 29/41791; H01L 29/66795–29/66818; H01L 29/785–29/7856; H01L 2029/7857–7858; H01L 2924/13067; H01L 29/04–045; H01L 29/16–1608; H01L 29/18–185; H01L 29/22–2206; H01L 29/36–365; H01J 2237/334–3348; Y10S 977/938

See application file for complete search history.

(56) References Cited

U.S. PATENT DOCUMENTS

| | | | |
|---|---|---|---|
| 2016/0079428 A1* | 3/2016 | Zhao | H01L 29/7853 257/347 |
| 2017/0148796 A1* | 5/2017 | Basker | H01L 27/1104 |

* cited by examiner

Primary Examiner — Scott B Geyer

(57) ABSTRACT

A method of forming a three-dimensional transistor device. The method may include providing a fin array on a substrate, the fin array comprising a plurality of fin structures, formed from a monocrystalline semiconductor, and disposed subjacent to a hard mask layer. The method may include directing angled ions at the fin array, wherein the angled ions form a non-zero angle of incidence with respect to a perpendicular to a plane of the substrate. The angled ions may etch the plurality of fin structures to form a stack of isolated nanowires, within a given fin structure.

15 Claims, 9 Drawing Sheets

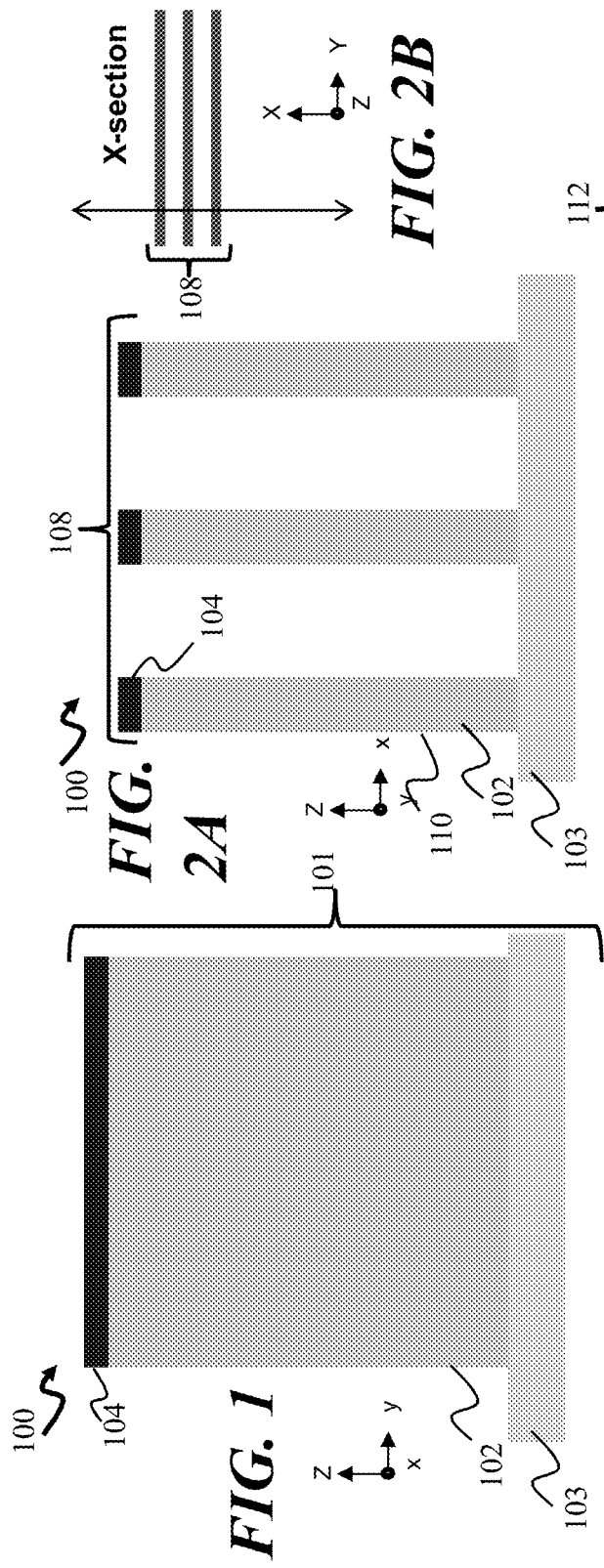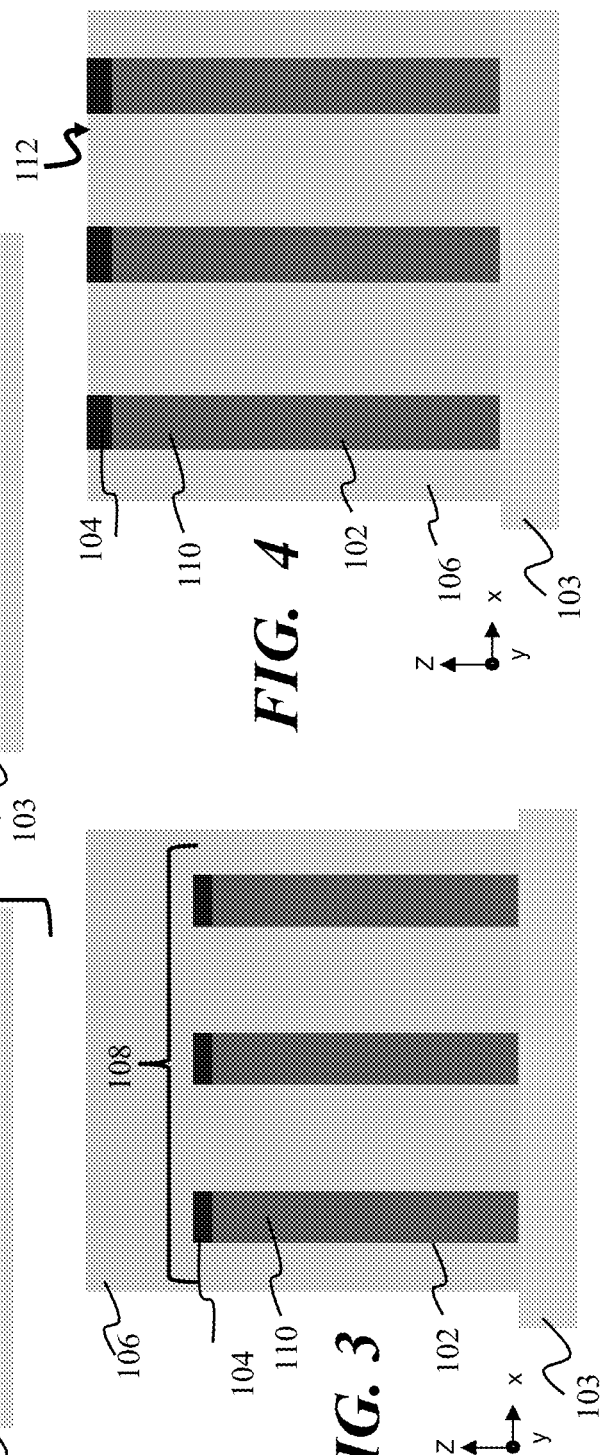

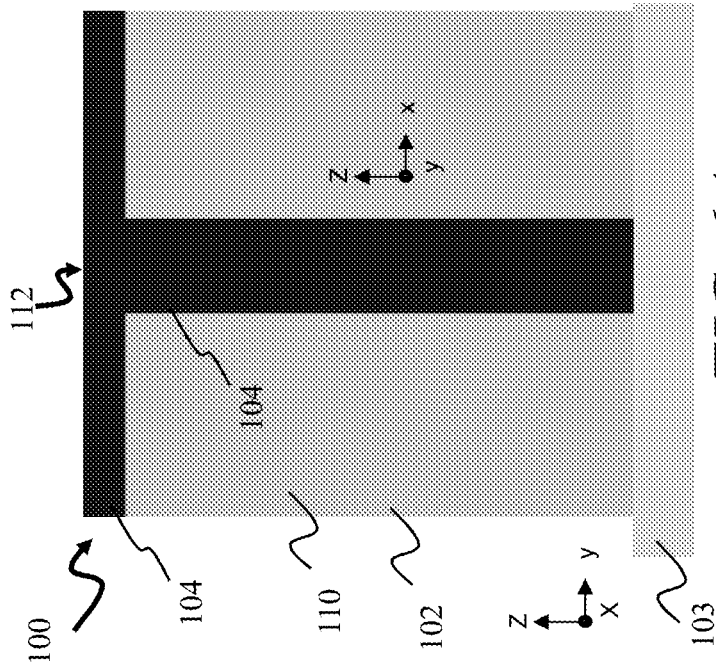
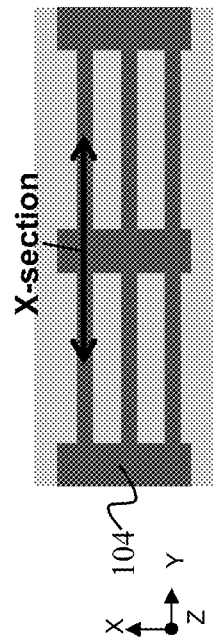
FIG. 6A
FIG. 6B
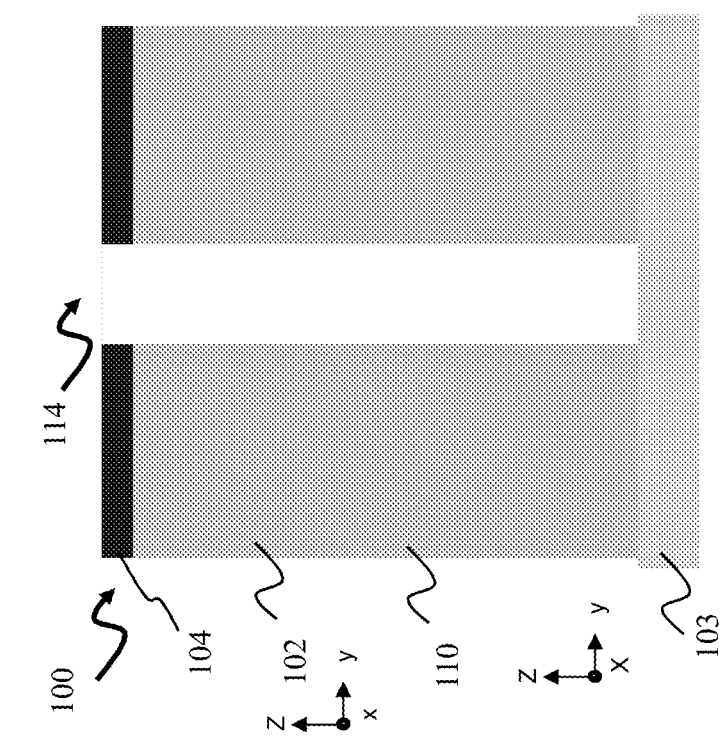
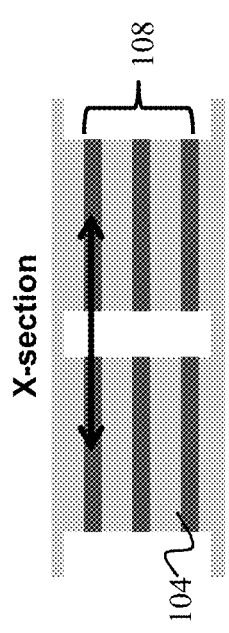
FIG. 5A
FIG. 5B

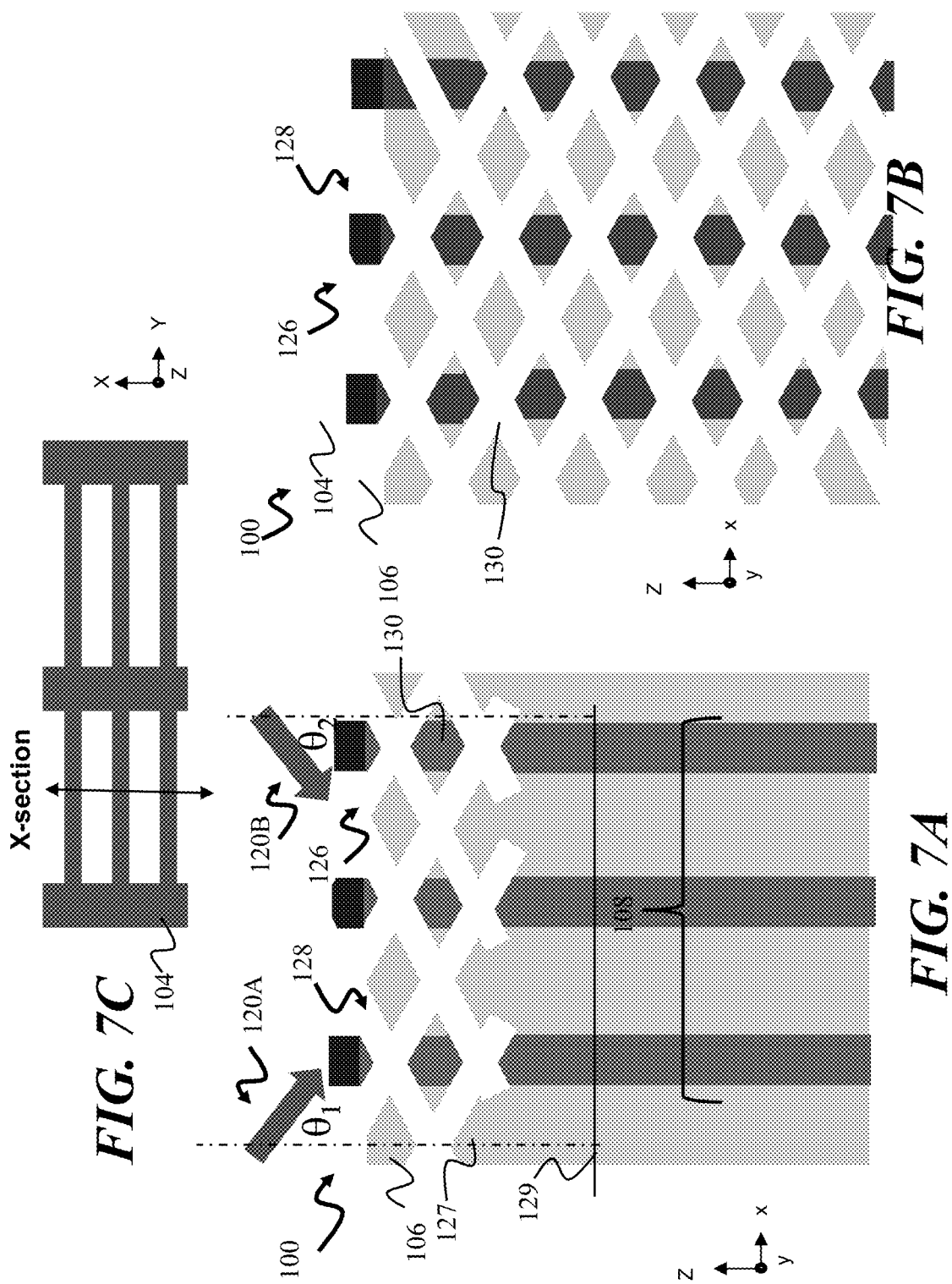

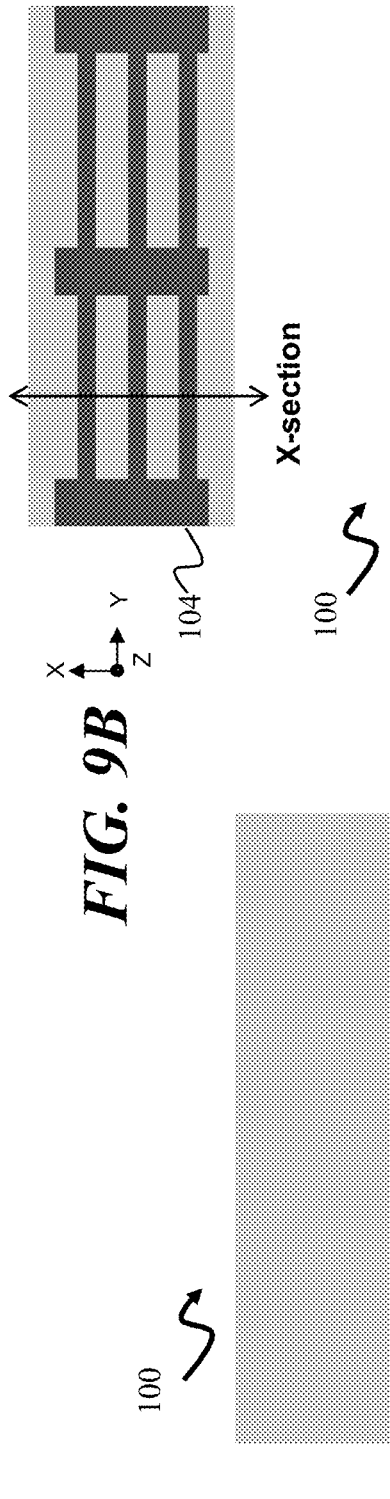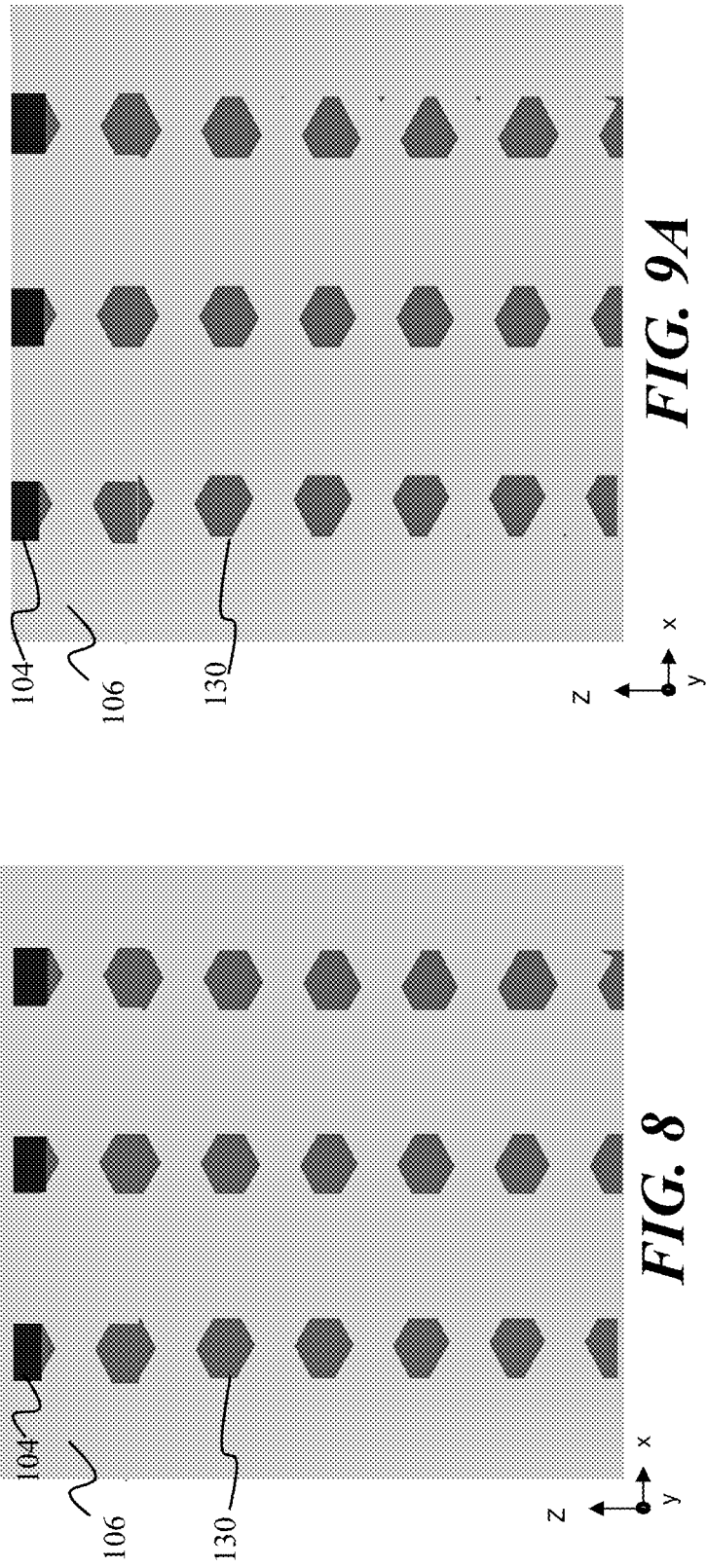

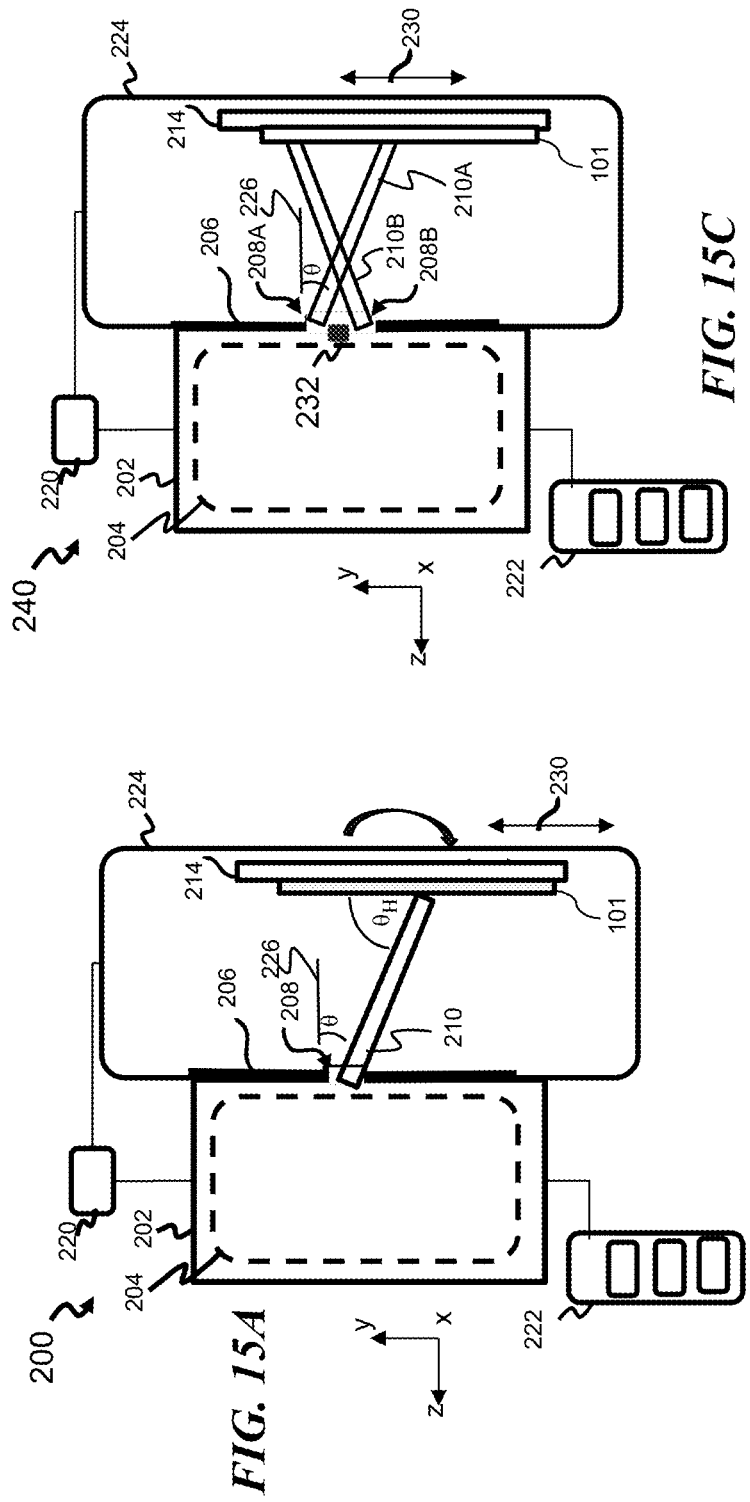
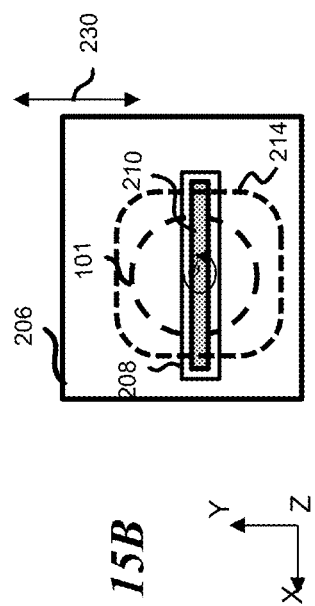
FIG. 15C
FIG. 15B
FIG. 15A

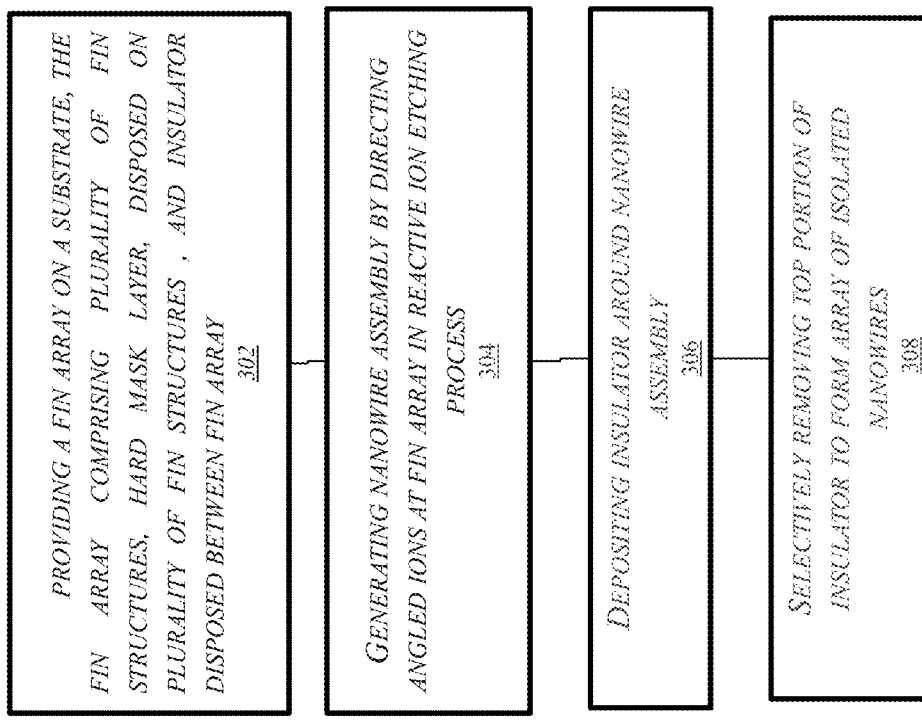

US 10,607,847 B1

GATE ALL AROUND DEVICE AND METHOD OF FORMATION USING ANGLED IONS

FIELD

The present embodiments relate to semiconductor device structures, and more particularly, to structures and processing for three dimensional transistor devices.

BACKGROUND

As semiconductor devices scale to smaller dimensions, the ability to harness device improvements with decreased size becomes more challenging. The synthesis of three-dimensional semiconductor transistors, such as fin type field effect transistors (finFET), gate-all-around transistor devices (GAA), or horizontal gate all around (HGAA) transistor devices involves challenging processing issues. HGAA structures are often referred to as a nanosheet device because the HGAA transistor formation entails formation of multi-layers of nanometer-thick sheets of two different semiconductor materials grown in an epitaxial heterostructure. An example is a Si/SiGe superlattice stack composed of alternating silicon and silicon:germanium alloy (SiGe) layers, and arranged in a vertical configuration having an overall fin shape. The formation of final HGAA structures according to known techniques involves selectively removing the silicon:germanium layer (in the case of silicon devices), to form nanowire structures made of silicon, from which structures, the HGAA transistor is fabricated.

These known approaches entail several drawbacks. Including a limitation on the number of nanowires fabricated in a stack, due to mechanical instability of the fins. Another drawback is a relatively low device yield resulting from the strain in silicon nanowires grown in a Si/SiGe superlattice. A further drawback is the inherent difficulty in forming a SiGe channel for PFET devices.

With respect to these and other considerations, the present disclosure is provided.

BRIEF SUMMARY

In one embodiment, a method of forming a three-dimensional transistor device may include providing a fin array on a substrate, the fin array comprising a plurality of fin structures, formed from a monocrystalline semiconductor, and disposed subjacent to a hard mask layer. The method may include directing angled ions at the fin array, wherein the angled ions form a non-zero angle of incidence with respect to a perpendicular to a plane of the substrate. The angled ions may etch the plurality of fin structures to form a stack of isolated nanowires, within a given fin structure.

In another embodiment, a method of forming a gate-all-around transistor device is provided. The method may include providing a fin array on a substrate, the fin array comprising a plurality of fin structures, formed from monocrystalline silicon. The fin array may further include a hard mask layer, disposed on the plurality of fin structures. The method may include directing first angled ions at a first non-zero angle of incidence with respect to a perpendicular to a plane of the substrate, and directing second angled ions at a second non-zero angle of incidence with respect to the perpendicular, opposite the first non-zero angle of incidence. The first angled ions and the second angled ions may together etch the plurality of fin structures to form a stack of isolated nanowires, within a given fin structure.

In another embodiment, a semiconductor device is provided, including a substrate; and a nanowire assembly, disposed over the substrate. The nanowire assembly may include a plurality of nanowire stacks, arranged adjacent to one another along a first direction. A given nanowire stack of the plurality of nanowire stacks may include at least two nanowires, disposed in a vertical array along a second direction, perpendicular to the first direction, wherein the at least two nanowires extend along a third direction, perpendicular to the second direction and the first direction. The at least two nanowires may be characterized by a polygonal cross-section.

BRIEF DESCRIPTION OF THE DRAWINGS

FIG. 1 depicts an end cross-sectional view of a semiconductor device structure, at one stage of fabrication, according to embodiments of the disclosure;

FIG. 2A depicts an end cross-sectional view of the semiconductor device structure of FIG. 1, at another stage of fabrication, according to embodiments of the disclosure;

FIG. 2B depicts a top plan view of the semiconductor device structure of FIG. 2A;

FIG. 3 depicts an end cross-sectional view of the semiconductor device structure of FIG. 1, at another stage of fabrication, according to embodiments of the disclosure;

FIG. 4 depicts an end cross-sectional view of the semiconductor device structure of FIG. 1, at a further stage of fabrication, according to embodiments of the disclosure;

FIG. 5A depicts a side cross-sectional view of the semiconductor device structure of FIG. 1, at another stage of fabrication, according to embodiments of the disclosure;

FIG. 5B depicts a top plan view of the semiconductor device structure of FIG. 5A;

FIG. 6A depicts a side cross-sectional view of the semiconductor device structure of FIG. 1, at another stage of fabrication, according to embodiments of the disclosure;

FIG. 6B depicts a top plan view of the semiconductor device structure of FIG. 6A;

FIG. 7A depicts an end cross-sectional view of the semiconductor device structure of FIG. 1, at another stage of fabrication, during processing with angled ions, according to embodiments of the disclosure;

FIG. 7B depicts an end cross-sectional view of the semiconductor device structure of FIG. 7A, after further processing using angled ions;

FIG. 7C depicts a top plan view of the semiconductor device structure of FIG. 7B;

FIG. 8 depicts an end cross-sectional view of the semiconductor device structure of FIG. 1, at another stage of fabrication, according to embodiments of the disclosure;

FIG. 9A depicts an end cross-sectional view of the semiconductor device structure of FIG. 1, at another stage of fabrication, according to embodiments of the disclosure;

FIG. 9B depicts a top plan view of the semiconductor device structure of FIG. 9A;

FIG. 15A, shows a processing apparatus, depicted in schematic form, according to some embodiments of the disclosure;

FIG. 15B depicts a top plan view of the geometry of an extraction plate, according to some embodiments of the disclosure; and FIG. 15C shows another processing apparatus, depicted in schematic form, according to further embodiments of the disclosure; and FIG. 16 depicts a process flow, according to embodiments of the disclosure.

DETAILED DESCRIPTION

Figure 11B:
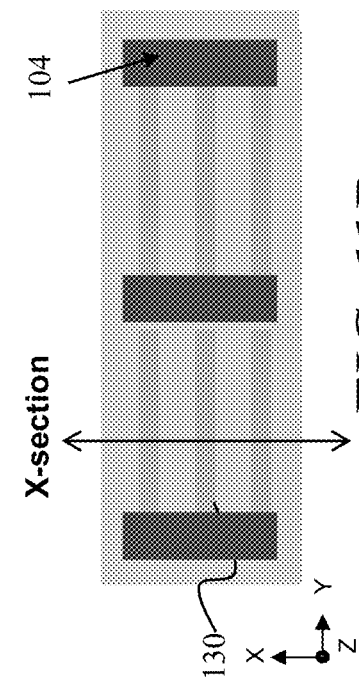
FIG. 11B depicts a top plan view of the semiconductor device structure of FIG. 11A.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques to form semiconductor devices, including three-dimensional transistors, formed in a semiconductor substrate. As is known, three dimensional transistors, such as HGAA transistors, may be arranged in circuitry to form various types of logic devices, as well as memory devices. An HGAA structure as disclosed herein may be implemented in a metal oxide semiconductor (MOS) transistor device, include a CMOS device architecture, where both NFET nanowire and PFET nanowire devices are formed, from vertical stacks of nanowires. These stacks may be referred to herein as "nanowire stacks," where a nanowire stack of a first polarity may be a P-type nanowire stack, and a nanowire stack of a second polarity may be an N-type nanowire stack.

Turning now to FIG. 1 there is shown an end cross-sectional view of a semiconductor device structure 100, at one stage of fabrication, according to embodiments of the disclosure. The semiconductor device structure 100 includes a substrate base 103, where the substrate base 103 may be formed within a substrate 101, and may be composed of monocrystalline silicon in various embodiments. The substrate base may include various other structures as known in the art.

At this stage, a monocrystalline body 102 extends above the substrate base 103, where the monocrystalline body 102 may be monocrystalline silicon, integrally formed from the substrate base 103. The monocrystalline body 102 may be formed as a mesa or similar structure, to serve as a basis for forming a plurality of semiconductor fin structures. The monocrystalline body 102 is disposed subjacent to a mask layer 104, as shown. In various embodiments, the mask layer may be a hard mask material, such as silicon nitride. The embodiments are not limited in this context.

FIG. 2A depicts an end cross-sectional views of the semiconductor device structure 100, at a later stage of fabrication. At this stage, the monocrystalline body 102 has been patterned to generate a fin array 108, on (or in) the substrate 101. The fin array 108 may include a plurality of fin structures, shown as fin structures 110, where the fin structures 110 are formed from the monocrystalline semiconductor material of the monocrystalline body 102. In some non-limiting embodiments, the height of the fin structures 110 (along the Z axis of the Cartesian coordinate system shown) may range from 50 nm to 300 nm. The fin array 108 may be formed by known lithography and etch processes where the mask layer 104 acts as a hard mask to selectively etch the monocrystalline body 102 when exposed to a known reactive ion etching process. As such the mask layer 104 is segmented into isolated portions, extending over the fin structures 110.

FIG. 2B depicts a top plan view of the semiconductor device structure of FIG. 2A. As shown in FIG. 2B, the fin structures of the fin array 108 are elongated along the Y-axis. As such, transistors may be formed from the fin structures 110, where current generally flows along the direction parallel to the Y-axis.

FIG. 3 depicts an end cross-sectional views of a semiconductor device structure, at another stage of fabrication, according to embodiments of the disclosure. At this stage of fabrication, a blanket insulator has been deposited over the fin array 108, shown as insulator 106. The insulator may be an oxide such as flowable oxide in various embodiments. The insulator 106 may cover the fin array 108 as shown and may fill the regions between fin structures 110.

FIG. 4 depicts an end cross-sectional views of the semiconductor device structure 100, at a further stage of fabrication, according to embodiments of the disclosure. At this stage, an etching/polishing operation has been performed, such as chemical mechanical polishing (CMP) to form a planar surface 112, where the mask layer 104 is exposed. For example, in embodiments where insulator 106 is silicon oxide and mask layer 104 is silicon nitride, the CMP process may be designed to remove silicon oxide and stop on silicon nitride.

FIG. 5A depicts a side cross-sectional view of the semiconductor device structure 100 of FIG. 1, at another stage of fabrication, according to embodiments of the disclosure. In this stage, a fin cut operation has been performed to form truncated fin structures, from which structures transistor devices may be created, as more clearly shown in FIG. 5B, depicting a top plan view of the semiconductor device structure of FIG. 5A. The fin cut operation may be performed using known lithography and etch processes.

FIG. 6A depicts a side cross-sectional view of the semiconductor device structure 100, at another stage of fabrication, according to embodiments of the disclosure. At this stage, a mask layer deposition operation has been performed to deposit mask material over the structure of FIG. 5B. The mask layer deposition operation may be a blanket deposition. According to various embodiments, the material of the mask layer deposition operation of FIG. 6A may be the same as the material of mask layer 104. Thus, in one embodiment, the material deposited in the operation of FIG. 6A may be silicon nitride, while the original material of mask layer 104 may also be silicon nitride. The material deposited in FIG. 6A may form in trenches 114 between the fin structures 110 along the Y-axis, as also shown in FIG. 6B, depicting a top plan view of the semiconductor device structure of FIG. 5A. For simplicity, this material is also shown as mask layer 104. As shown in FIG. 6A and FIG. 6B, the mask layer 104 may be etched back to form a planar surface, where the planar surface may correspond to the planar surface 112 of FIG. 4. In this example, the mask layer 104 is disposed just above fin structures 110 (and in trenches 114 at the ends of the fin structures), and forms a coplanar surface with the top of insulator 106 (see FIG. 4).

FIG. 7A depicts an end cross-sectional view of the semiconductor device structure of FIG. 1, at another stage of fabrication, according to embodiments of the disclosure. At this stage, angled ions are directed at the at the fin array 108. In this example, the angled ions comprise first angled ions 120A, directed at a first non-zero angle of incidence $\theta_1$ with respect to a perpendicular 127 to a plane 129 of the substrate 101. The angled ions also include second angled ions 120B, directed at a second non-zero angle of incidence $\theta_2$ with respect to the perpendicular 127, opposite the first non-zero angle of incidence. In the process of FIG. 7A, for practical applications, the absolute value for the angle of incidence (+/− with respect to the perpendicular 127) of angled ions may range between 10 degrees and 80 degrees, and in particular embodiments between 10 degrees and 50 degrees. The embodiments are not limited in this context.

In the operation of FIG. 7A, the angled ions may be directed in a reactive ion beam etching operation, where first angled ions 120A and second angled ions 120B are provided as ion beams for performing reactive ion etching. Thus, the semiconductor material of the fin structures 110 may be preferentially etched with respect to the mask layer 104. The material of insulator 106 may also be preferentially etched with respect to the mask layer 104. Thus, in embodiments where the mask layer 104 is silicon nitride, the fin structures 110 are silicon, and the insulator 106 is oxide, a known reactive ion etching recipe may be used to selectively etch oxide and silicon with respect to silicon nitride. As such, at least a portion of the mask layer 104 may be preserved during the process of FIG. 7A. As depicted in FIG. 7A, the first angled ions 120A and the second angled ions 120B form trenches 126 and trenches 128, respectively. These trenches are angled trenches, tending to etch through fin structures 110 at a non-zero angle. Notably, the trenches 126 and trenches 128 may extend into the substrate 101 at angles corresponding to $\theta_1$ and $\theta_2$. Because the mask layer 104 is etched at a much slower rate than the insulator 106 and fin structures 110, the presence of the individual portions of the mask layer 104 act to shadow subjacent regions in the semiconductor device structure 100. This shadowing results in defining the width of the trenches 126 and trenches 128, discussed further below, with respect to FIG. 12. Notably, while just three portions of the mask layer 104 are shown, in the example of FIG. 7A, other portions of the mask layer 104, extending over other fin structures 110 (not shown) are assumed to be present.

In the instance of FIG. 7A, the trenches 126 and trenches 128 have etched the fin structures 110 to the extent that a first group of isolated semiconductor regions have been formed in the fin structures 110, near the tops of the fin structures. These isolated semiconductor regions are shown as nanowires 130.

Continuing with the operation of FIG. 7A, FIG. 7B depicts the device structure at a later instance, when the trenches 126 and trenches 128 have been extended, further etching the fin structures 110. FIG. 7C depicts a top plan view of the semiconductor device structure of FIG. 7B. The etching of the semiconductor device structure 100 in FIG. 7B has proceeded to the extent that several rows of the nanowires 130 have been formed, extending well below the top surface of the semiconductor device structure 100.

FIG. 8 depicts an end cross-sectional view of the semiconductor device structure of FIG. 1, at another stage of fabrication, according to embodiments of the disclosure. At this stage, the device structure of FIG. 7B has been refilled with insulator 106, such as silicon oxide. The insulator 106 may be deposited in a blanket deposition process, such as a flowable oxide process. The insulator 106 may form in regions between nanowires 130, as shown. The insulator 106 may also extend above the nanowires 130 and the mask layer 104.

FIG. 9A depicts an end cross-sectional view of the semiconductor device structure of FIG. 1, at another stage of fabrication, according to embodiments of the disclosure. FIG. 9B depicts a top plan view of the semiconductor device structure of FIG. 9A. At this stage, a process, such as a CMP process, has been performed to remove a portion of the insulator 106, to form a planar structure where the insulator 106 is coplanar with the mask layer 104, exposing the top of the mask layer 104.

Figure 10B:
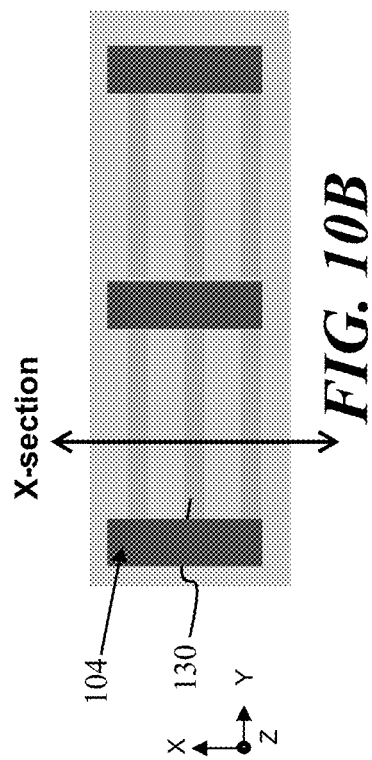
FIG. 10B depicts a top plan view of the semiconductor device structure of FIG. 10A.
Figure 10A:
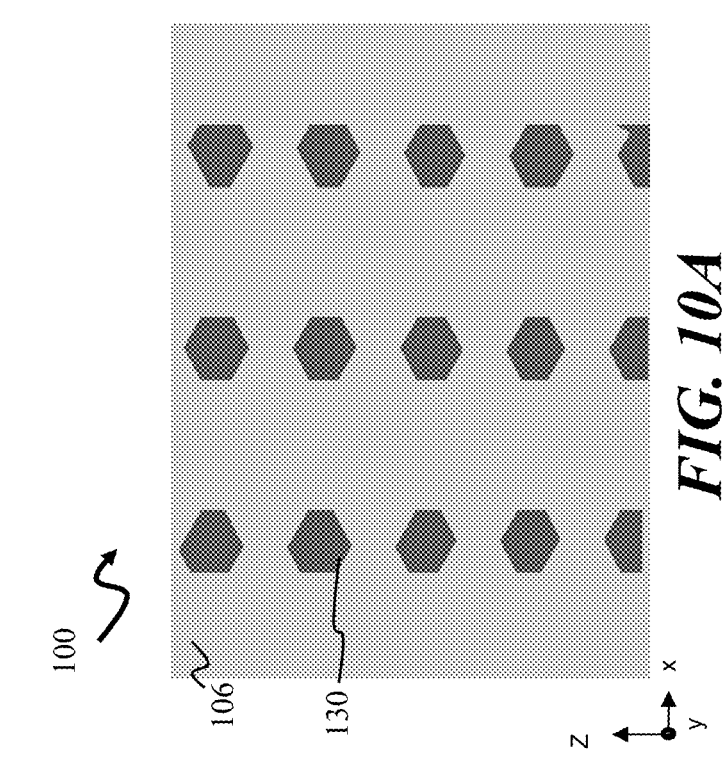
FIG. 10A depicts an end cross-sectional view of the semiconductor device structure of FIG. 1, at another stage of fabrication, according to embodiments of the disclosure.

FIG. 10A depicts an end cross-sectional view of the semiconductor device structure of FIG. 1, at another stage of fabrication, according to embodiments of the disclosure. FIG. 10B depicts a top plan view of the semiconductor device structure of FIG. 10A. At this stage, a non-selective etching operation has been performed to remove a top region of the device structure of FIG. 9A. The non-selective etching process may be a known reactive ion etching process designed to etch silicon nitride, silicon, and silicon oxide at similar rates. In addition to removal of insulator 106, both the mask layer 104 and semiconductor material forming nanowires 130 may be removed to a determined extent. For example, the top row of the nanowires 130 of FIG. 9A may be removed, so that four rows of the nanowires 130 remain. This depiction is merely exemplary, and in other embodiments, the operation may proceed to leave any number of rows of nanowires.

Figure 11A:
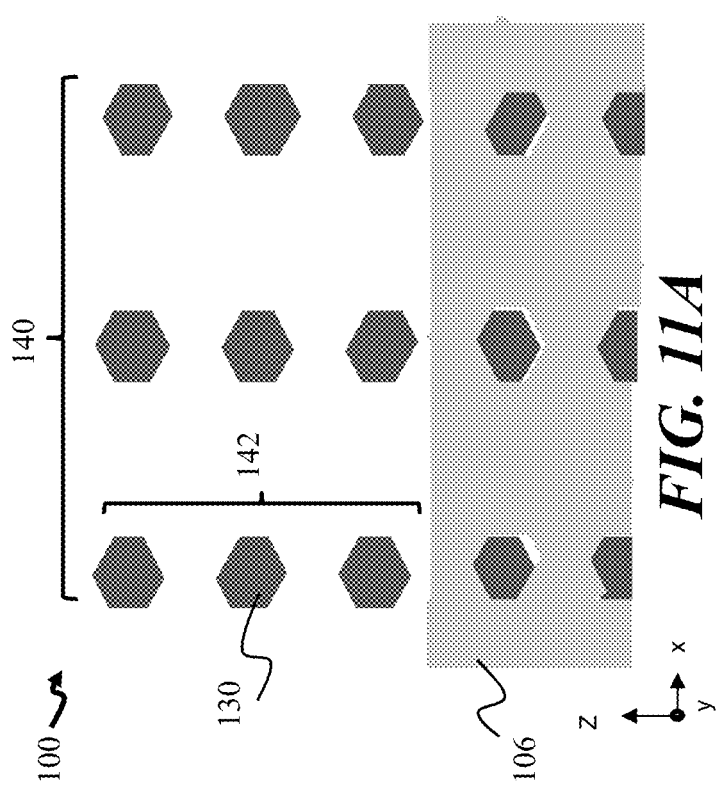
FIG. 11A depicts an end cross-sectional view of the semiconductor device structure of FIG. 1, at another stage of fabrication, according to embodiments of the disclosure.

FIG. 11A depicts an end cross-sectional view of the semiconductor device structure of FIG. 1, at another stage of fabrication, according to embodiments of the disclosure. FIG. 11B depicts a top plan view of the semiconductor device structure of FIG. 11A. At this stage, an upper portion of the insulator 106 has been removed in regions between the upper three rows of the nanowires 130, so that the nanowires 130 are isolated and exposed. While not shown in FIG. 11A, the nanowires 130 may be anchored on end regions to other portions of the semiconductor device structure 100 by mask layer material, such as SiN, which material is filled at the fin cut area as shown in FIG. 11B. The removal of the insulator 106 may be accomplished using an isotropic etch, including a known dry isotropic etch such as a Siconi™ etch, or similar etch, where oxide is etched selectively with respect to silicon and SiN.

As particularly shown in FIG. 11A, a nanowire assembly 140 has been formed, including three rows of nanowires, where the nanowire assembly 140 includes a plurality of nanowire stacks, shown as nanowire stacks 142, arranged adjacent to one another along a first direction, meaning along the X-axis. While in this embodiment a nanowire stack includes 3 nanowires, in other embodiments a given nanowire stack may include at least two nanowires, such as two nanowires, four nanowires, five nanowires, and so forth. As shown, the nanowire stack 142 includes a plurality of the nanowires 130, disposed in a vertical array along a second direction, perpendicular to the first direction, in this case, along the Z-axis, while the nanowires 130 extend along a third direction, perpendicular to the second direction and the first direction, in this case, along the Y-axis. In the example of FIG. 11A, the resulting nanowires have a polygonal cross-section, and in particular, a hexagonal cross-section. The hexagonal cross-section may provide an advantage with respect to known nanowires, such as nanowires having a cross sectional shape that is square or rectangular, which geometry generates a 90° corner angle. This 90-degree corner may generate a higher electrical field at each corner when gate bias is applied, which field can cause an unacceptable threshold voltage (Vt) variation. Notably, a hexagonal cross-sectional shape provides on average a larger corner angle (120°). Therefore, a reduced the electric field will be generated at each corner under gate bias. As such, the hexagonal shaped nanowires of the present embodiments may provide greater Vt control compared to known rectangular or square cross-section nanowires.

Notably, in some embodiments of the disclosure, the semiconductor device structure 100 of FIG. 11A may processed according to known GAA FET processing operations to form a transistor gate structure and source/drain regions using the nanowires 130. As such, the formation of isolated nanowires according to FIGS. 1A-11B presents a novel manner to form stacks of nanowires, while not using a heteroepitaxial system, such as silicon/silicon:germanium to construct the nanowire stacks. While the techniques shown may be applied to formation of nanowires of different diameters and pitches, the approach may be especially useful for smaller pitches such as 100 nm or less, or 50 nm or less. With such small pitches, the width of nanowires may be on the order of 20 nm or less, such as 10 nm or less.

Figure 12:
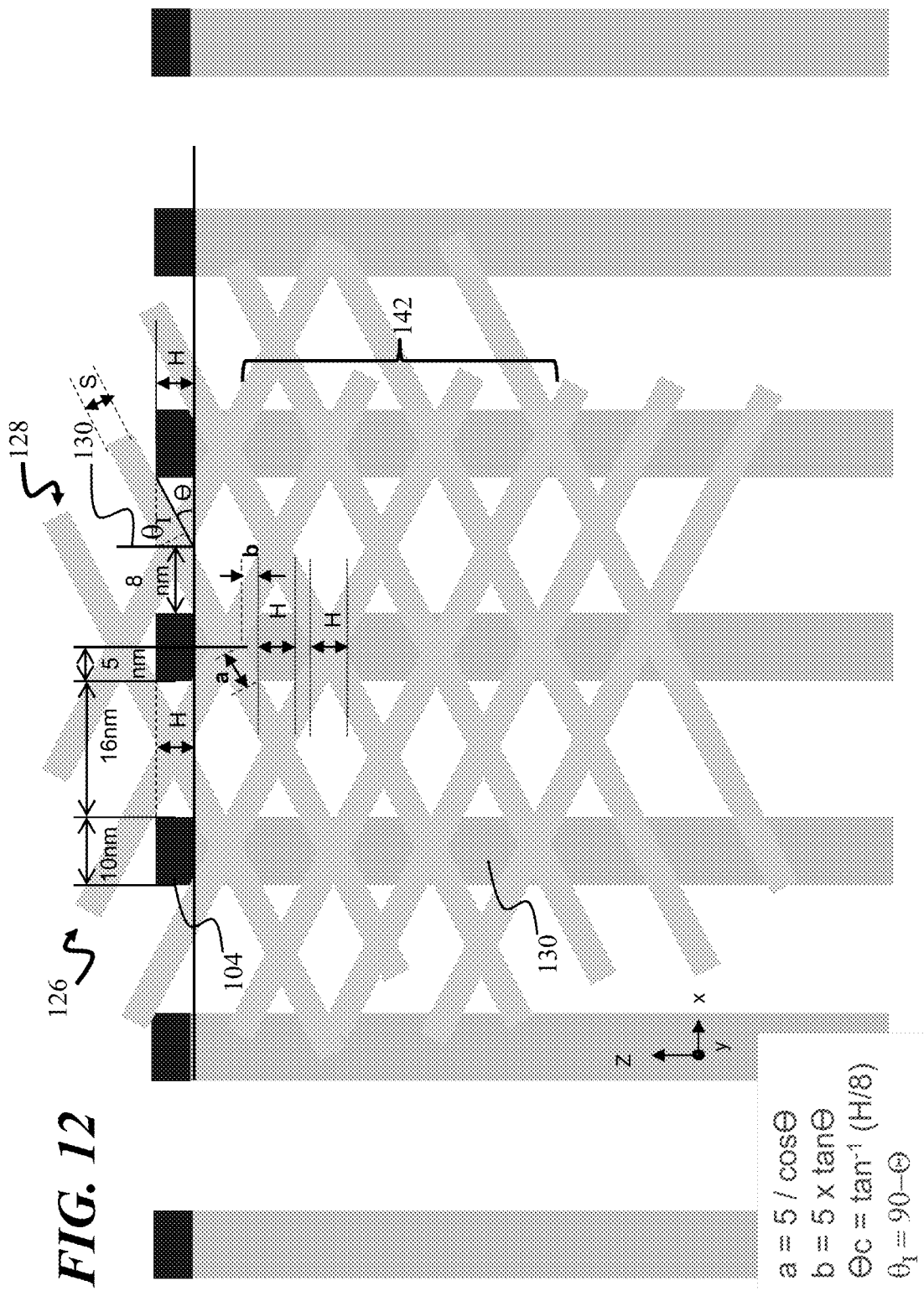
FIG. 12 depicts details of the geometry for forming a nanowire assembly using angled ions according to embodiments of the disclosure.

FIG. 12 depicts details of the geometry for forming a nanowire assembly using angled ions according to embodiments of the disclosure. For clarity, some trenches of the trenches 126 and trenches 128 are omitted, while parts of the trenches are shown extending above the actual substrate top surface 131. FIG. 12 highlights the fact that the angle of inclination $\Theta_I$ of the trenches 126 or trenches 128 (which angle may be equivalent to the non-zero angle of inclination θ of the first angled ions 120A and second angled ions 120B) is defined by the height H of the isolated patterning features of the mask layer 104, as well as the pitch between adjacent stacks of the nanowires stacks 142 along the X-direction. In one specific non-limiting example, explicitly shown in FIG. 12, the pitch may be assumed to be 26 nm, while the width of nanowires 130 is 10 nm. With this geometry, a parameter $\theta_c$ may be determined based upon a triangle formed having a side equal to half the width between adjacent nanowire stacks, which value is 8 nm (=(26−10)/2). The other side of the right triangle is the height. Thus, θc is calculated as the tan−1 (H/8 nm) where H is in nanometers. The value of $\Theta_I$ is just the complement of θc. Table I provides exemplary values $\theta_I$ for different values of H, (from 10 nm to 30 nm) assuming a 10 nm width of nanowires 130 and pitch of 26 nm. Depending upon the selectivity of etching of the mask layer 104 with respect to the subjacent materials, such as silicon and silicon oxide, a lesser or greater height of the mask layer 104 may be called for. As shown, the value of $\theta_I$ decreases for increasing H, becoming quite steep, just 15 degrees from perpendicular for 30 nm height. This steeper angle entails a greater etch depth along the Z-axis to form three nanowires, as also shown in Table. I. In particular, the etch depth required to create N number of nano-wires (along the Z-direction)=((N+1)×Fin pitch)/cos θc.

TABLE I

| H (nm) | $\Theta_I$ (degree) | a (nm) | b (nm) | Etch depth (nm) for 3 nano wires |
|---|---|---|---|---|
| 10 | 38.7 | 8 | 6.2 | 166 |
| 20 | 22 | 13.5 | 12.3 | 279 |
| 30 | 15 | 20 | 18.6 | 402 |

Figure 14:
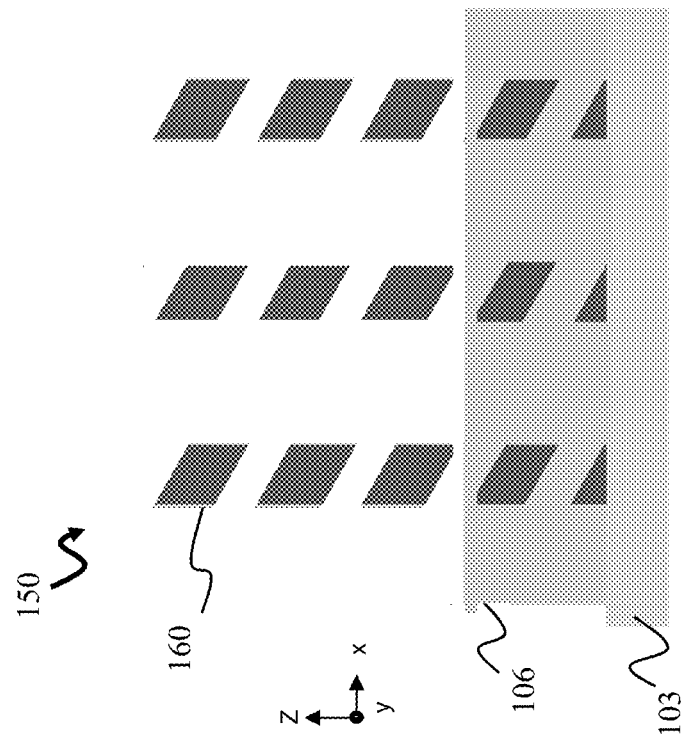
FIG. 14 depicts an end cross-sectional views of the semiconductor device structure of FIG. 13, at a later stage of fabrication, according to embodiments of the disclosure.
Figure 13:
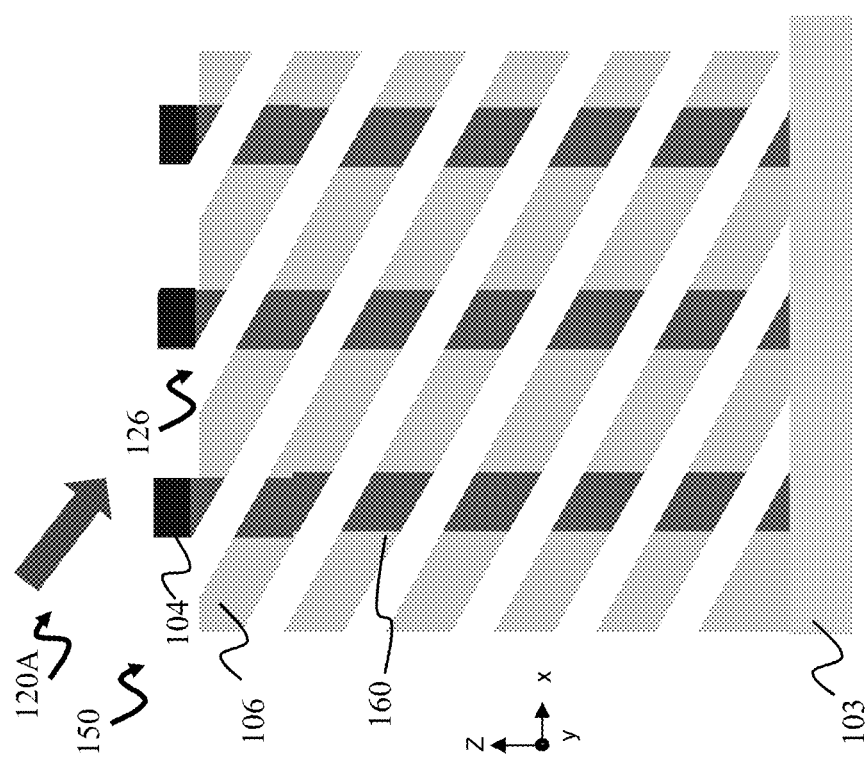
FIG. 13 depicts an end cross-sectional views of another semiconductor device structure, at one stage of fabrication, according to embodiments of the disclosure.

FIG. 13 depicts an end cross-sectional views of a semiconductor device structure 150, at one stage of fabrication, according to embodiments of the disclosure. FIG. 14 depicts an end cross-sectional views of the semiconductor device structure of FIG. 13, at a later stage of fabrication, according to embodiments of the disclosure. In this embodiment, the processing may proceed according to FIG. 1A to FIG. 6B. To form nanowires in this embodiment, just one set of ions is used, shown as first angled ions 120A, where the geometry of first angled ions 120A may follow the geometry described above. As such, just one set of trenches is formed, in this case, the trenches 126. By etching the semiconductor device structure 150 to a sufficient extent, these trenches may extend entirely through the fin structures 110, generating the nanowires 160. In FIG. 14, the stage of processing corresponds to the processing stage of FIG. 11B. Thus, isolated nanowires have been formed, differing from the nanowires 130 in the cross-sectional shape, in this case, a four-sided polygon, having a diamond shape.

In further embodiments of the disclosure, angled ions may be provided as an ion beam to etch trench isolation structures. Turning now to FIG. 15A, there is shown a processing apparatus 200, depicted in schematic form. The processing apparatus 200 represents a processing apparatus for performing angled ion etching of a substrate, such as forming angled trenches to generate isolated nanowires, as described above. The processing apparatus 200 may be a plasma-based processing system having a plasma chamber 202 for generating a plasma 204 therein by any convenient method as known in the art. An extraction plate 206 may be provided as shown, having an extraction aperture 208, where an angled ion beam 210 may be extracted to direct angled ions to a substrate 101. The substrate 101, including, for example, the fin array 108, is disposed in the process chamber 224. A substrate plane of the substrate 101 is represented by the X-Y plane of the Cartesian coordinate system shown, while a perpendicular to the plane of substrate lies along the Z-axis (Z-direction).

As further shown in FIG. 15A, the angled ion beam 210 may be extracted when a voltage difference is applied using bias supply 220 between the plasma chamber 202 and substrate 101, or substrate platen 214, as in known systems. The bias supply 220 may be coupled to the process chamber 224, for example, where the process chamber 224 and substrate 101 are held at the same potential.

According to various embodiments, the angled ion beam 210 may be extracted at a non-zero angle of incidence, shown as θ, with respect to the perpendicular 226. The trajectories of ions within the angled ion beam 210 may be mutually parallel to one another or may lie within a narrow angular range, such as within 10 degrees of one another or less. Thus, the value of θ may represent an average value of incidence angle where the individually trajectories vary up to several degrees from the average value. In various embodiments, the angled ion beam 210 may be extracted as a continuous beam or as a pulsed ion beam as in known systems. For example, the bias supply 220 may be configured to supply a voltage difference between plasma chamber 202 and process chamber 224, as a pulsed DC voltage, where the voltage, pulse frequency, and duty cycle of the pulsed voltage may be independently adjusted from one another.

In various embodiments, a suitable gas or combination of gases, may be supplied by the source 222 to plasma chamber 202. The plasma 204 may generate various species to perform reactive ion beam etching, depending upon the exact composition of species provided to the plasma chamber 202. The species provided by source 222 may be designed according to material to be etched, such as known reactive ion etching species for etching silicon.

In various embodiments, the angled ion beam 210 may be provided as an angled ribbon ion beam having a long axis extending along the X-direction of the Cartesian coordinate system shown in FIG. 15B. By scanning a substrate platen 214 including substrate 101 with respect to the extraction aperture 208, and thus with respect to the angled ion beam 210 along the scan direction 230, the angled ion beam 210 may etch exposed portions of a semiconductor fin(s) disposed on the substrate 101.

In this example of FIG. 15B, the angled ion beam 210 is provided as a ribbon ion beam extending to a beam width along the X-direction, where the beam width is adequate to expose an entire width of the substrate 101, even at the widest part along the X-direction. Exemplary beam widths may be in the range of 10 cm, 20 cm, 30 cm, or more while exemplary beam lengths along the Y-direction may be in the range of 2 mm, 3 mm, 5 mm, 10 mm, or 20 mm. A ratio of beam width to beam length may be in the range 5/1, 10/1, 20/1 50/1, or 100/1. The embodiments are not limited in this context.

Notably, the scan direction 230 may represent the scanning of substrate 101 in two opposing (180 degrees) directions along the Y-direction, or just a scan toward the left or a scan toward the right. As shown in FIG. 2B, the long axis of angled ion beam 210 extends along the X-direction, perpendicularly to the scan direction 230. Accordingly, an entirety of the substrate 101 may be exposed to the angled ion beam 210 when scanning of the substrate 101 takes place along a scan direction 230 to an adequate length from a left side to right side of substrate 101, as shown in FIG. 2B.

Returning also to FIG. 15A, in accordance with various embodiments, the angled ion beam 210 may be supplied in a plurality of scans of the substrate 101, by rotating the substrate 101 through 180 degrees between scans. Thus, in a first scan, the angled ion beam 210 may be directed as first angled ions 126, while in a second scan the angled ion beam 210 may be directed as second angled ions 128, by rotating the substrate 101 180 degrees between the first scan and second scan, while not changing the actual orientation of an ion beam, such as angled ion beam 210.

In other embodiments of the disclosure, a modified apparatus may be used to provide simultaneous etching of a semiconductor fin in different directions. Turning now to FIG. 15C, there is shown another processing apparatus 240, depicted in schematic form. The processing apparatus 240 represents a processing apparatus for performing angled ion treatment of a substrate and may be substantially the same as the processing apparatus 200, save for the differences discussed below. Notably, the processing apparatus 240 includes a beam blocker 232, disposed adjacent the extraction aperture 208. The beam blocker 232 is sized and positioned to define a first aperture 208A and a second aperture 208B, where the first aperture 208A forms a first angled ion beam 210A, and the second aperture 208B forms a second angled ion beam 210B. The two angled ion beams may define angles of incidence with respect to the perpendicular 226, equal in magnitude, opposite in direction. The beam blocker offset along the Z-axis with respect to extraction plate 206 may help define the angle of the angled ion beams. As such, the first angled ion beam 210A and the second angled ion beam 210B may treat opposing sidewalls of a semiconductor fin similarly and simultaneously, as generally depicted in FIG. 2C. When configured in the shape of a ribbon beam as in FIG. 15B, these angled ion beams may expose an entirety of the substrate 101 to reactive ion etching of semiconductor fins distributed in devices across the substrate 101, by scanning the substrate platen 214 as shown.

FIG. 16 depicts an exemplary process flow 300, according to embodiments of the disclosure. At block 302, a fin array is provided on a substrate, where the fin array includes a plurality of fin structures. A hard mask layer is disposed on the fin structures and an insulator is disposed between the fin array. The fin array may be composed of a monocrystalline semiconductor, such as silicon. The hard mask layer may differ from the insulator, where the hard mask layer may be silicon nitride, while the insulator is silicon oxide.

At block 304, a nanowire assembly is formed from the fin array by directing angled ions at the fin array in a reactive ion etching process. In some embodiments, the angled ions may be directed at a non-zero angle of incidence with respect to a perpendicular to a plane of the substrate, where the angle of incidence varies between 10 degrees and 80 degrees. As such, the hard mask may shadow the angled ions to generate a plurality of trenches that etch through the fin structures at different vertical levels to form the nanowires. In some embodiments, the fin angled ions may be provided in an angled ribbon ion beam or may be provided in a pair of angled ribbon ion beams, directed in opposite trajectories at the fin array, to form a network of intersecting trenches that serve to define the nanowires.

At block 306, an insulator is deposited around the nanowire assembly. As such, open regions created by the trenches may be backfilled, and the top of the nanowire assembly may be covered with insulator.

At block 308, a top portion of the insulator is selectively removed. The selective removal may be performed in a manner to not etch the semiconductor material of the nanowire assembly. The selective removal may be preceded by anon-selective removal of the insulator to etch both insulator and top rows of nanowires, as needed. The selective removal may accordingly generate an array of isolated nanowires, anchored on ends, while otherwise being exposed on the surfaces for further processing.

The present embodiments provide various advantages over known HGAA device processes. For one advantage, the present approaches enable formation of nanowires while not using a complicated superlattice growth process where alternating layers of silicon and silicon:germanium are grown. The present approaches have the further advantages of avoiding the strain in silicon nanowires grown in a Si/SiGe superlattice, and avoiding the difficulty in forming a SiGe channel for PFET devices.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a three-dimensional transistor device, comprising:
   providing a fin array on a substrate, the fin array comprising a plurality of fin structures, formed from a monocrystalline semiconductor, and disposed subjacent to a hard mask layer; and
   directing angled ions at the fin array, wherein the angled ions form a non-zero angle of incidence with respect to a perpendicular to a plane of the substrate, wherein the angled ions etch the plurality of fin structures to form a stack of isolated nanowires, within a given fin structure.

2. The method of claim 1, wherein the directing the angled ions comprises directing first angled ions at a first non-zero angle of incidence with respect to the perpendicular, and directing second angled ions at a second non-zero angle of incidence with respect to the perpendicular, opposite the first non-zero angle of incidence.

3. The method of claim 1, wherein a value of the non-zero angle of incidence ranges between 10 degrees and 80 degrees.

4. The method of claim 3, wherein the value of the non-zero angle of incidence ranges between 10 degrees and 50 degrees.

5. The method of claim 1, wherein the monocrystalline semiconductor comprises silicon, and wherein the hard mask layer comprises silicon nitride.

6. The method of claim 1, wherein the directing the angled ions comprises performing a reactive ion beam etching operation, wherein the fin structures are preferentially etched with respect to the hard mask layer.

7. The method of claim 1, wherein during the directing the angled ions, an oxide fill material is disposed between the fin structures.

8. The method of claim 7, wherein the directing the angled ions comprises performing a reactive ion beam etching operation for selectively etching the oxide fill material and the fin structures with respect to the hard mask layer.

9. The method of claim 1, wherein the directing the angled ions comprises directing an angled ribbon ion beam to the substrate in a reactive ion beam etch.

10. A method of forming a gate-all-around transistor device, comprising:
    providing a fin array on a substrate, the fin array comprising:
       a plurality of fin structures, formed from monocrystalline silicon; and
       a hard mask layer, disposed on the plurality of fin structures;
    directing first angled ions at a first non-zero angle of incidence with respect to a perpendicular to a plane of the substrate;
    and directing second angled ions at a second non-zero angle of incidence with respect to the perpendicular, opposite the first non-zero angle of incidence,
    wherein the first angled ions and the second angled ions together etch the plurality of fin structures to form a stack of isolated nanowires, within a given fin structure.

11. The method of claim 10, wherein the directing the first angled ions takes place simultaneously to the directing the second angled ions.

12. The method of claim 10, wherein during the directing the first angled ions and the directing the second angled ions, an oxide fill material is disposed between the fin structures.

13. The method of claim 12, wherein the first angled ions and second angled ions selectively etch the oxide fill material and the fin structures with respect to the hard mask layer.

14. The method of claim 10, wherein the first non-zero angle of incidence and the second non-zero angle of incidence comprise an absolute value of 10 degrees to 50 degrees.

15. The method of claim 10, wherein the first angled ions comprise a first angled ribbon ion beam and the second angled ions comprise a second angled ribbon ion beam, wherein the first angled ribbon ion beam and the second angled ribbon ion beam are extracted from a plasma chamber and directed to the substrate when the substrate is disposed in a process chamber, adjacent the plasma chamber.

* * * * *